Jan. 10, 1967 P. H. FOWLER 3,297,968

PIEZOELECTRIC CERAMIC TRANSFORMER

Filed March 28, 1962 2 Sheets-Sheet 1

INVENTOR.
PETER H. FOWLER
BY
Emery, Booth, Miller, & Townsend
ATTORNEY

Jan. 10, 1967 P. H. FOWLER 3,297,968

PIEZOELECTRIC CERAMIC TRANSFORMER

Filed March 28, 1962 2 Sheets-Sheet 2

INVENTOR.
PETER H. FOWLER

BY
Emery, Booth, Miller, + Townsend

ATTORNEY

United States Patent Office 3,297,968

Patented Jan. 10, 1967

3,297,968

PIEZOELECTRIC CERAMIC TRANSFORMER

Peter H. Fowler, Sudbury, Mass., assignor to Vibrasonics, Inc., Boston, Mass., a corporation of Massachusetts Filed Mar. 28, 1962, Ser. No. 183,286
4 Claims. (Cl. 333—72)

This invention relates to piezoelectric ceramic transformers.

Transformers of the type with which this invention is concerned are used in electrical circuits to transform impedances for matching purposes, and to transform voltages with respect to magnitude and/or phase and to present a low impedance to a selected band of frequencies. As such, they have particular application as filter transformers in I.F. amplifier circuits.

The term "piezoelectric ceramic" is used to designate ferroelectric ceramic materials which are electrostatically polarizable to exhibit piezoelectric properties. Examples of such ceramic materials are barium titanate, lead titanate, lead zirconate and the rare earth oxides, as well as various combinations of the above materials.

These piezoelectric resonators or transformers conventionally comprise a thin, flat, plate of one of the aforementioned ceramics such as, for example, barium titanate which is polarized in the thickness direction; that is, in a direction perpendicular to the plane of the plate. Conductively associated with the main faces of the plate are electrodes for applying to the plate and deriving from the plate, fluctuating voltage signals. Due to the relative thinness of the plate and to the high coupling coefficient characteristic of the ceramic material, substantially the entire piezoelectric response of such plate to a voltage input fluctuating near a resonant frequency of the body and while applied between its main faces, is in the lateral modes and takes the form of mechanical vibration the amplitude of which is maximum when the frequency of the applied voltage is the same as the resonant frequency of the body. Due to the reverse piezoelectric effect also exhibited by the material, these lateral mode vibrations cause, in turn, a proportional and frequency-corresponding fluctuating voltage between the main faces of and which may be derived from the body.

The above-described piezoelectric and resonance properties will be understood to invest the instant ceramic devices with voltage and impedance transformation capabilities, and to enable them to function also as highly selective wave filters.

While devices of the type here concerned have been used successfully as wave filters and as voltage transformers in conventional electronic circuits, because of poor impedance transformation ratios and matching capabilities, and because of low mechanical Q's at resonance, they have proved generally unsatisfactory as impedance transformers particularly in transistorized circuit applications where maximum power transfer is essential.

The aforementioned difficulties occasioned with prior devices were due primarily to the construction of the electrodes, and their location on the ceramic plate. It being supposed that the input and output impedances as well as the efficiency of a ceramic transformer depended primarily on the placement on the ceramic plate of and the ratio of the impedances or areas of the input and output electrodes, in the manufacture of the transformers it has been the practice to cut a ceramic plate to resonate at and so to present a low impedance to a particular desired frequency or band of frequencies and then to place the two input electrodes over the entire portion of the plate subjected to one piezoelectric stress distribution and the two output electrodes over the entire portion of the plate subjected to another different such stress distribution. Resultantly, the electrodes of one of the above sets took the form of centrally located discs and those of the other consisted of concentric rings. Efforts were made to match the source and load impedances by adjusting the impedance or area ratio of the discs and rings. However, the extent to which the ratio could be varied was circumscribed by the aforesaid limits as well as by the size of the ceramic plate itself and the minimum input electrode area necessary to drive the plate to resonance. For example, a 2:1 impedance transformation required approximately a 1:2 ratio of input to output electrode areas. Accordingly, only small impedance transformations could be obtained, in the order of 10:1 or less. Since in most applications the source impedance is more than ten times the load impedance, as a practical matter the two impedances were not matched; there was considerable sower loss. Even in those applications where transformations of less than 10:1 were desired, proper matching was not obtained because of the difficulty in making the aforesaid required critical placement on the plate of the extremely small electrodes, which placement differed with different operating conditions, and because as soon as a prior transformer was placed in a circuit and subjected to any conditions of loading, the piezoelectric stress distribution in the plate shifted and changed thereby changing the selected impedance transformation ratio, reducing the energy coupled into the plate and further reducing the efficiency of the device. Other attempts to solve the problem resulted in rather elaborate resonators utilizing a plurality of different size ceramic plates either laminated or ganged together. Aside from the high cost of fabricating those hybrid devices, they have proved unsatisfactory because they produce spurious bending modes which adversely effect the response characteristics of those devices.

Heretofore, ceramic transformers suffered also because the concentric electrodes prevented the transformers from being operated effectively in the fundamental, or most efficient mode of vibration. The mechanical Q of the transformer was made too small; insufficient energy was coupled to the load. Resultantly, the prior devices were operated only slightly more efficiently in the first or second overtone which operation required a larger ceramic plate or resonator to pass a given frequency and also produced a spurious frequency response from the fundamental frequency which often was stronger than the chosen overtone and which in many cases had to be filtered out by additional circuitry. The prior devices were disadvantaged also because the electrical connections to the outer ring electrode vibrated vigorously with the plate. Connections were often broken and slight changes in the orientation of an electrical lead with respect to the plate often materially affected the vibration of the plate and hence the band pass characteristics and efficiency of the transformer.

Applicant has improved the art of piezoelectric ceramic transformers by providing a simplified transformer construction costing in the order of one-half as much as prior comparable devices and by which input and output electrodes are more easily constructed and exactly positioned on the plate or resonator and by which the ratio of the areas of and the configuration on the plate of the input and output electrodes always remain the same regardless of the particular desired pass band and of the particular source and load impedances associated with the device.

With the transformers made in accordance with this invention, circuits having impedance ratios of up to 20:1 or more can be matched exactly. It will be understood also that the match obtained by the invention transformer can be accomplished readily and efficiently, and when mated to the particular circuit conditions, the device will always have efficient power transfer and excellent band pass characteristics for the desired frequency particularly adapting the instant device to function as a filter transformer in transistorized I.F. amplifiers. Moreover, the same transformer can subsequently be tuned readily and inexpensively in the field to match certain different circuits or to pass certain different frequencies without any reduction in power transfer or operating efficiency.

The transformers of this invention are particularly adapted to vibrate in the fundamental mode and to have a high mechanical Q, in the order of 450, at resonance. Unwanted overtone modes are damped by the electrodes obviating the requirement of additional filtering circuitry. Also the devices are considerably smaller and more efficient than prior transformers having concentric electrodes and as are adapted for overtone mode response.

Further, transformers made in accordance with this invention are reversible. That is, the direction of coupling through them is immaterial; there is no needed distinction between input and output terminals of the device; they are completely interchangeable thereby greatly simplifying the fabricating and installing of the device. The reversible quality of these transformers is also of direct value in certain communications systems requiring the use of amplifiers operating either simultaneously or sequentially in either direction of transmission, as is the case with certain telephone repeater amplifiers.

Still further, the instant transformer is more accurate and also more rugged than prior comparable devices because electrical connections to the electrodes from without are always made at nonvibrating, or nodal points on the resonator, and they neither affect nor are affected by the vibration of the plate or the operation of the transformer.

In the illustrated embodiment:

Figure 1:
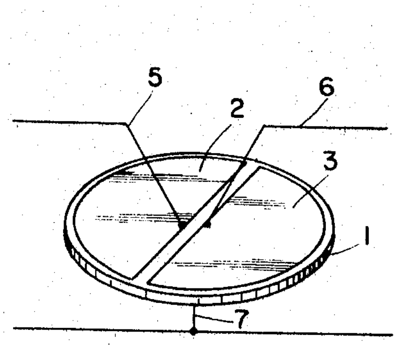
FIG. 1 is a perspective view from above of a ceramic transformer made in accordance with the present invention.
Figure 2:
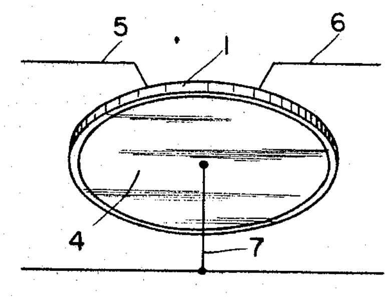
FIG. 2 is a perspective view from below of the device of FIG. 1.
Figure 3:
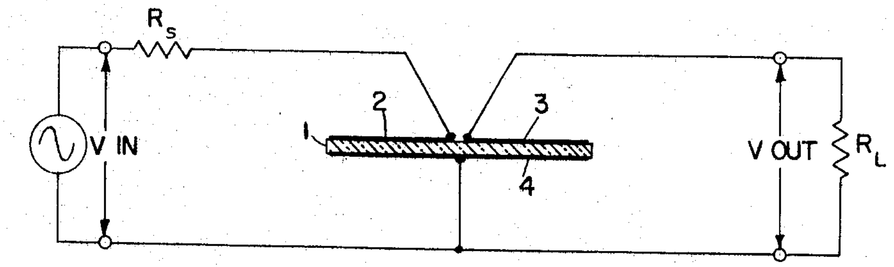
FIG. 3 is the device of FIGS. 1 and 2 in vertical section and coupling together a source and a load.

Referring to the drawings, particularly FIGS. 1–3, the invention transformer comprises a thin, flat body or plate or crystal 1 of an usual ferro-electric material such as, for example, barium titanate and which is polarized in the thickness direction, that is such as to make the axis of polarization perpendicular to the main faces or surfaces of the body. Body 1 may take the form of a circle, a square with or without rounded corners, regular polygon or other shapes having three-fold symmetry about an axis perpendicular to its plane so long as the body has its piezoelectric stress response substantially entirely in the lateral modes, that is, in the plane of the body when vibrating near its resonance frequencies. However, because of ease of fabricating and superior operating results, the circular or discoid plate shape of FIGS. 1–3 is preferred and will be referred to for purposes of example.

Applied or attached to either main face of body 1, say the upper, are a pair of conducting surfaces 2, 3 which comprise the input and output electrodes of the transformer, and which, as will be described hereinafter, are entirely functionally interchangeable. Applied to the remaining, say lower, main face of plate 1 is a third conducting surface 4 which comprises the base electrode common to both input and output sides of the transformer. Usually the above-described three-terminal device is preferred, but if for some reason a four-terminal transformer is desired, in accordance with this invention the single common electrode 4 may be replaced by a pair of input and output electrodes always corresponding to and opposing electrodes 2, 3. The conducting surfaces or electrodes 2–4 usually consist of silver or platinum paint which is coated or applied to the faces of body 1 in any convenient way such as, for example, by silk screening. After the electrodes are applied to the body 1, that may be axially polarized in the usual way as by applying a D.C. electric field between the thus coated main faces of the body.

Finally electrical leads 5–7 may be soldered or otherwise connected to electrodes 2–4 respectively and will hereinafter be more particularly described.

The aforementioned advantages obtained with the instant transformer construction result from the novel construction and arrangement on plate 1 of the electrodes 2–4 developed pursuant to the following considerations.

Figure 4:
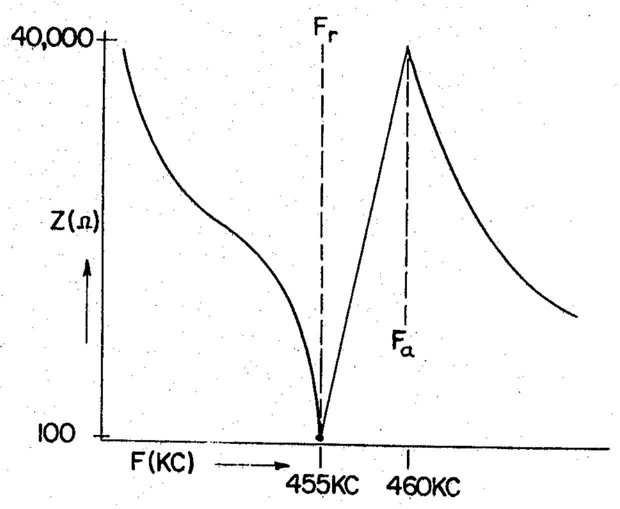
FIG. 4 is a graphic representation of the impedance near resonance of the device of FIGS. 1–3 with the output terminals open circuited.

The impedance near resonance of a ceramic body may be represented by the graph of FIG. 4 where $F_r$=frequency at resonance
$F_a$=frequency at antiresonance.

For a typical ceramic body or crystal of good geometry vibrating in the fundamental mode, the impedance at $F_a$ may be as much as a thousand times greater than the impedance at $F_r$. For example and as seen in FIG. 4, the discoid body 1 having a natural or resonant frequency in the fundamental mode at 455 KCs may have an impedance of less than 100 ohms at $F_r$ and more than 40,000 ohms at $F_a$. It will be seen from FIG. 4 that when a ceramic body such as here concerned is coupled to a source impedance in the above range there will exist some frequency between $F_r$ and $F_a$ at which the body will provide an exact impedance match to and will absorb maximum power from the source. This impedance range between $F_r$ and $F_a$ is reduced when the body is coupled also to a load. However, it has been found that when the capacitance between the input electrodes is made large there still exists a very wide range of impedance between $F_r$ and $F_a$ so that even if the body is coupled to a very small load or in other words to an effective short circuit, the crystal is still able to match exactly a source impedance between, say, 500 ohms and 20,000 ohms. It will be understood that the aforementioned range includes the source impedances found in most practical circuit applications. For example, in normal transistorized amplifier circuits, the load resistance or second stage transistor base-input resistance is of the order of 200–500 ohms, while the source resistance is of the order of 8,000–15,000 ohms. These values of source resistance are seen to be well within the impedance range between $F_r$ and $F_a$ of the input electrode. It is seen also from FIG. 4 that as long as the above conditions are met, a small change in source frequency produces a very large corresponding change in input impedance. Conversely, the effect of changing the values of source and load impedances is merely to shift the frequency of apparent resonance of the body. In view of this great dependence of the input impedance on frequency, the slight changes in the impedance contribution from electrode capacitance produced by changes in electrode area can, for all practical purposes, be ignored.

Under the invention then, to obtain the most possible input capacitance, the input electrodes are desirably constructed and arranged to cover as much as possible of the two main faces of plate 1. And to insure the most possible coupling of energy from the source into the body, the electrodes should also be close to the constrained center of the body.

Figure 5:
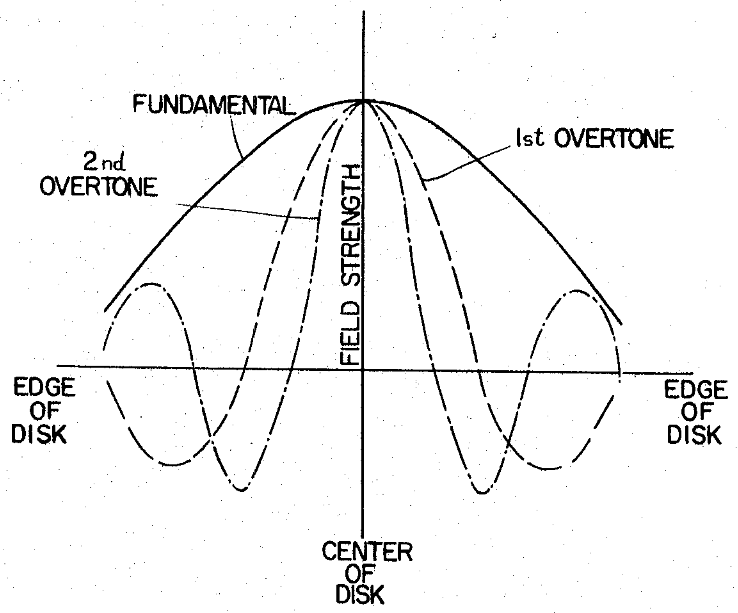
FIG. 5 is a graphic representation of the lateral piezoelectric stresses occurring in the device of FIGS. 1–3 when that is in resonance mode vibration.

It has been observed that for a given transformer, a higher Q and greater power transfer are obtained when the output electrodes are arranged to collect the maximum possible charge from plate 1. This occurs when plate 1 vibrates in the fundamental mode and when the output electrodes are constructed and arranged to cover as much as possible of the plate area subjected to the greatest amount of lateral piezoelectric stress. For the plates here concerned, the lateral stress distributions may be calculated or observed. For example, the plate of FIGS. 1–3 has stress distributions represented by the curves of FIG. 5. It is seen from FIG. 5 that there is maximum piezoelectric response and greatest stress distribution in plate 1 when the plate vibrates in the fundamental mode; the entire plate contributes electrical charges. Desirably then, the output electrodes should cover as much of the opposite faces of plate 1 as possible and particularly the face portions near the center of the body.

I have found in practice that a very high Q and excellent power transfer from source to load are obtained when the input and output electrodes are constructed and arranged on both faces of plate 1 so as to together cover substantially the entirety of the plate faces and so that the areas of and impedance between the input electrodes substantially equals the areas of and impedance between the output electrodes. Thus in the case of the particular transformer embodiment of FIGS. 1–3 comprising a discoid body or plate 1, input and output electrodes 2, 3 are preferably semicircular or D-shaped and arranged back-to-back on and so as each to cover equal portions of and together to cover substantially the entirety of one main face of plate 1. The electrodes 2, 3 are spaced apart along a narrow diametric strip only enough to electrically isolate them. To complete the input and output sides of the device, a single base electrode 4 is arranged on and to cover the entire remaining face of plate 1 for serving as an opposing electrode to both electrodes 2, 3. Or if a four-terminal transformer is preferred, electrode 4 may be replaced by two D-shaped input and output electrodes corresponding in size and shape to and arranged opposite electrodes 2 and 3 respectively. And without effecting the operation of the device, the edges of electrodes 2–4 may, if desired, be cut back slightly from the edge of the plate 1 to reduce the possibility of arcing between the electrodes on opposite faces of the plate during polarization of the plate if that is to be done after the electrodes are applied.

Other electrode 2, 3 shapes are contemplated within the invention such as triangular, rectangular, polygonal, depending on the particular shape of plate 1. But in every case, electrodes 2, 3 comprise two conducting surfaces arranged back-to-back on one main face of plate 1. The surfaces are spaced apart slightly along a line bisecting the plate face and each covers substantially one-half of the remainder of the face. And in every case, the transformer includes additional electrode means covering substantially the entire remaining main face of plate 1 and opposing electrodes 2, 3 such that the areas of and the impedance between the input eletcrodes substantially equal the areas of and impedance between the output electrodes.

It is a feature of this invention that the aforementioned electrode configuration greatly simplifies the fabricating of ceramic transformers. For the arrangement on plate 1 of input and output electrodes 2–4 and their 1:1 area and impedance ratios remain the same regardless of the desired pass band and of the particular sources and loads to be matched. In making the instant device, the ceramic body can simply be coated all over with a conducting paint. A narrow strip of paint can then be removed as by an air-jet along a line bisecting one face of the plate to form the input and output electrodes. Alternatively, a bisecting strip portion of one face can be masked during the coating process. In any case, the boundary between the input and output electrodes can be located at the same exact place on the plate for all transformers regarless of the desired pass band and the particular circuit in which the device is to be used. Yet it is apparent from the above discussion that very accurate impedance matches can be obtained with the invention transformer. More particularly, when one of my transformers is coupled between a given source of waves of a selected frequency and a load, it will adjust itself to match those by shifting its frequency of apparent resonance. Therefore, to obtain an accurate step up or step down impedance match for the selected pass frequency, I merely trim or grind down symmetrically the periphery of the transformer until the device resonates in the fundamental mode. Since the input and output electrodes are always arranged on opposite sides of a line bisecting the plate faces and cover equal areas of the plate, and since the plate itself has three-fold symmetry about its axis, the trimming affects all electrodes equally. The area and impedance ratios between the input and output electrodes are always 1:1. The input and output electrode sets will always each cover substantially one-half of the plate regardless of the ultimate size of the transformer assuring always the most possible coupling of energy into the plate and consistently high impedance transformation ratios. At resonance, the transformer has a high mechanical Q in the order of 450, the source and load impedances are matched and there is very efficient power transfer to the load. Of course, once the correct size is obtained for any given set of impedance and frequency conditions, the aforementioned calibrating becomes unnecessary. Subsequent devices may be cut directly to the correct size. In addition to mating the transformer to particular circuit conditions, the trimming or cutting operation also electrically isolates the electrodes on opposite faces of the plate. And it is important to note as well that the same transformer may be reused to match the same impedances at higher frequencies or to effect certain different impedance transformations at the same frequency merely by further trimming of the device in the manner above described.

Figure 6:
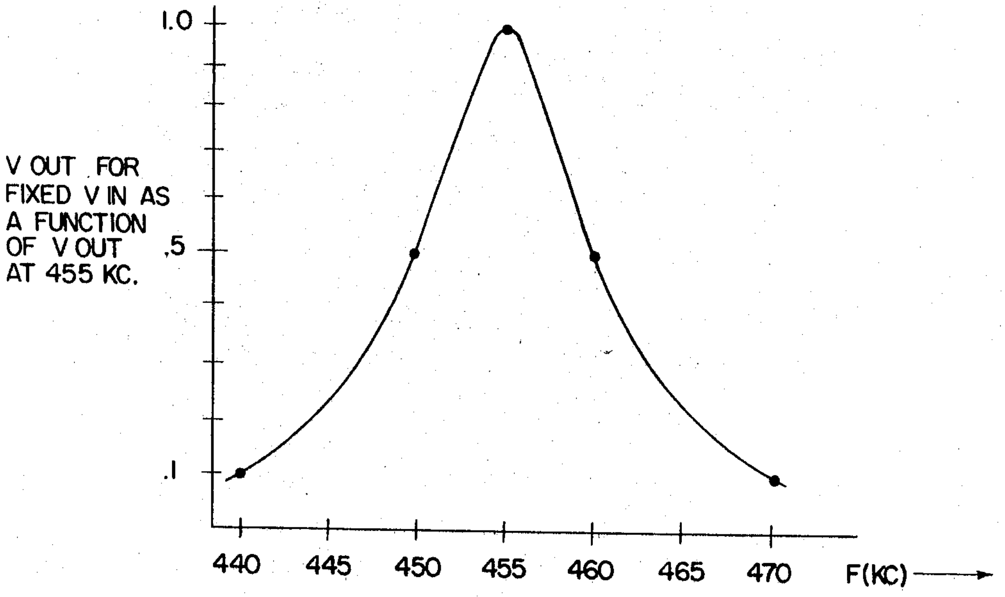
FIG. 6 is a graphic representation of the response characteristics of the device of FIGS. 1–3.

For example, a transformer made in accordance with this invention has been used successfully as a filter transformer in a transistorized I.F. amplifier circuit to match a 10,000 ohms source resistance to a 1,000 ohms load resistance and to pass a center frequency of 455 kc. That circuit is represented in FIG. 3 where $V_{in}$ is the alternating potential output from the first stage, $R_s$ is the 10,000 ohms series resistance therefrom, $R_1$ is the 1,000 ohms base-input resistance of the second stage transistor and $V_{out}$ is the potential coupled into the second stage. The transformer is of the discoid type having a lead zirconate plate of 0.020 inch thickness and a common base electrode. When the device was trimmed so that its diameter equalled 0.250 inch, it vibrated in the fundamental radial resonance mode and satisfied exactly the filter specifications. The transformer matched exactly the two I.F. stages and had typical response characteristics shown by the curve of FIG. 6. As is apparent, the response curve is characterized by a highly selective, sharply defined pass band and a high gain for the desired I.F. frequency. Yet, it is important to note that the diameter of the plate producing the above response is less than the diameter of the free or unloaded plate that would produce resonance vibrations naturally in the fundamental mode at 455 kc.

A further important feature of the invention transformer is that the construction and arrangement of the electrodes makes it reversible. More particularly, since the input and output halves of the device are always identical regardless of the circuit conditions, it is immaterial which of electrodes 2, 3 is connected to the source, and which is connected to the load. A given device can be used backwards or forwards in a given circuit eliminating the need for marking the terminals and greatly facilitating installation. And even though the two halves of the transformer are identical, there is still produced the desired step up or step down impedance transformation whichever way the device is used.

Since the device is reversible and can perform the same impedance transformation whichever way energy is coupled through it, it has particular application in certain communications circuits such as in a telephone repeater amplifier where it may be desired to operate the amplifier either simultaneously or sequentially in either direction of transmission.

Under my invention also, the electrical connections to the three or four transformer electrodes from without neither affect nor are affected by the vibration or oscillation of plate 1. Consequently, the instant transformer can be supported in use by its own electrical leads. More particularly, each of the input and output electrodes always has a portion thereof substantially at the axis or center of plate 1 to which an electrical lead may be attached. For the plates here-concerned, the center is a nodal point and remains essentially stationary when the plate vibrates at its resonance frequencies. Therefore, any variant conditions at the center of the plate as would be caused, for example, by different amounts of solder on the electrodes or bending or movement of the leads do not affect the vibration of the transformer or change its response characteristics. Too, the electrical connections themselves are not, as are connections at any other point on plate 1, subjected to the fracturing stresses caused by the rapid plate vibrations and which are a frequent source of transformer breakdown.

It will be appreciated that the manufacture and commercial distribution of transformers under this invention are greatly simplified because the transformers, complete with electrical leads and adapted for a very wide variety of circuit conditions, are identical and identically made until they are trimmed. All electrical connections to the transformers are made at points on the electrodes remote from the transformer edges. Thus the final trimming operation for tuning the device to particular circuit conditions can be performed in the shop or in the field by any relatively unskilled person using conventional grinding means.

I claim as my invention:

1. A reversible transformer for coupling a relatively high impedance circuit to a relatively low impedance circuit and for transferring energy in the form of electric waves of selected frequencies from one said circuit to the other comprising: a thin, axially polarized, discoid, piezoelectric, ceramic body having first and second parallel faces, said body also having substantially its entire piezoelectric resonance response in the radial mode; a pair of like, semicircular electrodes applied to said first face, said electrodes being spaced apart along a diametric strip of said first face and each of said electrodes covering substantially one-half of the remainder of said first face; additional electrode means opposing said pair of electrodes, said additional electrode means being applied to and covering substantially the entirety of said second face, the ratio of the impedance between one of said electrodes and said opposing electrode means to the impedance between the other of said electrodes and said opposing electrode means being approximately 1:1; first conducting means for electrically coupling either of said electrodes and said opposing electrode means to said relatively high impedance circuit; and second conducting means for electrically coupling the other of said electrodes and said opposing electrode means to said relatively low impedance circuit, the direction of coupling through said transformer being immaterial; said body having a diameter such that when said transformer is coupled between said circuits so as to resonate, said transformer passes electric waves of only said selected frequencies and matches said high impedance circuit to said low impedance circuit.

2. A transformer as defined in claim 1 wherein said additional electrode means consists of a single circular electrode having a diameter substantially equal to the diameter of said body.

3. A reversible transformer for coupling a source of electric waves to a load for maximum energy transfer comprising: a thin, axially polarized, discoid, piezoelectric, ceramic body having two parallel faces; a first pair of like semicircular electrodes applied to said body on opposite faces thereof; a second pair of like semicircular electrodes applied to said body on opposite faces thereof, said second pair of electrodes being spaced from said first pair of electrodes along a diameter of said body, the ratio of the areas of said first pair of electrodes to the areas of said second pair of electrodes being approximately 1:1; conducting means coupling either of said pairs of electrodes to either of said source and said load; and conducting means coupling the other of said pairs of electrodes to the other of said source and said load; said body having a diameter such that when said transformer is coupled between said source and said load so as to resonate, said transformer matches said source to said load.

4. A transformer comprising: an axially polarized, discoid, piezoelectric, ceramic plate having first and second parallel faces said plate being adapted to resonate at a determined frequency and having its piezoelectric response substantially entirely in the radial mode; first and second like semicircular electrodes applied to equal segments of said first face, said first and second electrodes being spaced apart slightly along a diameter of said first face; a third electrode applied to said second face, said third electrode opposing said first and second electrodes; electrical leads connected to each of said electrodes for coupling said transformer to a source and to a load, all of the connections between said leads and said electrodes being located substantially at the center of said plate said plate having a nodal point at its said center when resonating at said determined frequency.

References Cited by the Examiner

UNITED STATES PATENTS

| | | | |
|---|---|---|---|
| 2,906,973 | 9/1929 | Mason | 333—72 |
| 2,271,870 | 2/1942 | Mason | 333—72 |
| 2,277,709 | 3/1942 | McSkimin | 333—32 |
| 2,645,727 | 7/1953 | Willard | 310—9.6 |
| 2,799,789 | 7/1957 | Wolfskill | 310—9 |
| 2,830,274 | 4/1958 | Rosen | 333—72 |
| 2,976,501 | 3/1961 | Mattiat | 333—32 |
| 2,969,512 | 1/1961 | Taffe | 333—72 |
| 2,988,714 | 6/1961 | Tehon | 333—72 |

HERMAN KARL SAALBACH, *Primary Examiner*.

C. BARAFF, *Assistant Examiner*.